United States Patent
Jeong et al.

(10) Patent No.: US 7,863,201 B2
(45) Date of Patent: Jan. 4, 2011

(54) METHODS OF FORMING FIELD EFFECT TRANSISTORS HAVING SILICIDED SOURCE/DRAIN CONTACTS WITH LOW CONTACT RESISTANCE

(75) Inventors: Yong-Kuk Jeong, Gyeonggi-do (KR); Bong-Seok Suh, Kyunggi-do (KR); Dong-Hee Yu, Kyunggi-do (KR); Oh-Jung Kwon, Hopewell Junction, NY (US); Seong-Dong Kim, LaGrangeville, NY (US); O Sung Kwon, Wappingers Falls, NY (US)

(73) Assignees: Samsung Electronics Co., Ltd. (KR); International Business Machines Corporation, Armonk, NY (US); Infineon Technologies North America Corp., Milpitas, CA (US); Infineon Technologies AG, Neubiberg (DE)

(*) Notice: Subject to any disclaimer, the term of this patent is extended or adjusted under 35 U.S.C. 154(b) by 13 days.

(21) Appl. No.: 12/402,816

(22) Filed: Mar. 12, 2009

(65) Prior Publication Data
US 2009/0239344 A1 Sep. 24, 2009

Related U.S. Application Data

(60) Provisional application No. 61/038,900, filed on Mar. 24, 2008.

(51) Int. Cl.
*H01L 21/31* (2006.01)
*H01L 21/469* (2006.01)
*H01L 21/00* (2006.01)

(52) U.S. Cl. .............. 438/784; 438/783; 438/791; 438/795; 257/368; 257/382; 257/384

(58) Field of Classification Search ............... 438/783, 438/784, 791, 795–800
See application file for complete search history.

(56) References Cited

U.S. PATENT DOCUMENTS 7,297,584 B2  11/2007  Park et al.

(Continued)

FOREIGN PATENT DOCUMENTS

JP  2007-281318  10/2007

OTHER PUBLICATIONS

Miyagawa et al., "Local Bonding Structure of High-Stress Silicon Nitride Film Modified by UV Curing for Strained Silicon Technology beyond 45nm Node SoC Devices," Japanese Journal of Applied Physics, 46 (2007) pp. 1984-1988.

Sun et al, "Suppression of Cobalt Silicide Agglomeration Using Nitrogen ($N^+_2$) Implantation," IEEE Electron Device Letters, vol. 19, No. 5, May 1998, pp. 163-166.

*Primary Examiner*—Ha Tran T Nguyen
*Assistant Examiner*—Karen M Kusumakar
(74) *Attorney, Agent, or Firm*—Myers Bigel Sibley & Sajovec

(57) ABSTRACT

Methods of forming integrated circuit devices according to embodiments of the present invention include forming a PMOS transistor having P-type source and drain regions, in a semiconductor substrate, and then forming a diffusion barrier layer on the source and drain regions. A silicon nitride layer is deposited on at least portions of the diffusion barrier layer that extend opposite the source and drain regions. Hydrogen is removed from the deposited silicon nitride layer by exposing the silicon nitride layer to ultraviolet (UV) radiation. This removal of hydrogen may operate to increase a tensile stress in a channel region of the field effect transistor. This UV radiation step may be followed by patterning the first and second silicon nitride layers to expose the source and drain regions and then forming silicide contact layers directly on the exposed source and drain regions.

12 Claims, 4 Drawing Sheets

U.S. PATENT DOCUMENTS

| | | | |
|---|---|---|---|
| 2003/0157754 A1* | 8/2003 | Yamazaki et al. | 438/162 |
| 2003/0183875 A1* | 10/2003 | Isobe et al. | 257/347 |
| 2005/0173709 A1* | 8/2005 | Lee et al. | 257/79 |
| 2005/0218455 A1 | 10/2005 | Maeda et al. | |
| 2005/0245012 A1* | 11/2005 | Bu et al. | 438/197 |
| 2006/0009041 A1* | 1/2006 | Iyer et al. | 438/724 |
| 2006/0199305 A1* | 9/2006 | Chen et al. | 438/107 |
| 2006/0269692 A1* | 11/2006 | Balseanu et al. | 427/569 |
| 2008/0142902 A1 | 6/2008 | Chen et al. | |
| 2008/0272411 A1* | 11/2008 | Bo et al. | 257/288 |

* cited by examiner

METHODS OF FORMING FIELD EFFECT TRANSISTORS HAVING SILICIDED SOURCE/DRAIN CONTACTS WITH LOW CONTACT RESISTANCE

REFERENCE TO PRIORITY APPLICATION

This application claims priority to U.S. Provisional Application No. 61/038,900, filed Mar. 24, 2008, the disclosure of which is hereby incorporated herein by reference.

FIELD OF THE INVENTION

The present invention relates to methods of forming integrated circuit devices and, more particularly, to methods of forming field effect transistors having silicided source/drain contacts.

BACKGROUND OF THE INVENTION

Conventional methods of fabricating complementary metal oxide semiconductor (CMOS) field effect transistors may include formation of stress liners, which operate to increase electron and hole mobility in NMOS and PMOS field effect transistors, respectively. One such method is disclosed in U.S. Pat. No. 7,297,584 to Park et al., entitled "Methods of Fabricating Semiconductor Devices Having a Dual Stress Liner." In particular, the '584 patent to Park et al. discloses a dual stress liner, including a first liner portion formed on a PMOSFET and a second liner portion formed on an NMOSFET. Additional techniques to use stress to increase free carrier mobility in NMOS and PMOS devices are disclosed in US 2005/0218455 to Maeda et al., entitled "Low Noise and High Performance LSI Device, Layout and Manufacturing Method."

Techniques to form high-stress silicon nitride films for strained silicon technologies that use UV curing are also disclosed in an article by Y. Miyagawa et al., entitled "Local Bonding Structure of High-Stress Silicon Nitride Film Modified by UV Curing for Strained Silicon Technology Beyond 45 nm Node SoC Devices," Jpn. J. Appl. Phys., Vol. 46, pp. 1984-1988 (2007), and in US 2008/0142902 to Chen et al., entitled "Method for Fabricating Ultra-High Tensile-Stressed Film and Strained-Silicon Transistors Thereof."

Conventional CMOS fabrication techniques may also include steps to improve contact resistance by forming silicide contact regions on gate and source/drain regions of MOS transistors. As disclosed in JP 2007-281318 to Akihiro Shimizu et al., a laser annealing technique may be used to improve quality of nickel silicide films in MOSFET devices.

SUMMARY OF THE INVENTION

Methods of forming integrated circuit devices according to embodiments of the present invention include forming a field effect transistor (e.g., PMOS transistor) having P-type source and drain regions, in a semiconductor substrate, and then forming a diffusion barrier layer on the source and drain regions. A silicon nitride layer is deposited on at least portions of the diffusion barrier layer that extend opposite the source and drain regions. Hydrogen is removed from the deposited silicon nitride layer by exposing the silicon nitride layer to ultraviolet (UV) radiation. This removal of hydrogen may operate to increase a tensile stress in a channel region of the field effect transistor. This UV radiation step may be followed by patterning the first and second silicon nitride layers to expose the source and drain regions and then forming silicide contact layers directly on the exposed source and drain regions.

According to some of these embodiments of the present invention, the step of forming a diffusion barrier layer includes forming a first silicon nitride layer having a first concentration of hydrogen therein, on the source and drain regions. In addition, the step of forming a silicon nitride layer on at least portions of the diffusion barrier layer includes forming a second silicon nitride layer having a second concentration of hydrogen therein that is greater than the first concentration, on the first silicon nitride layer. The first silicon nitride layer may have a thickness in a range from about 50 Å to about 300 Å, and the second silicon nitride layer may have a thickness in a range from about 100 Å to about 1000 Å.

Moreover, the step of forming a first silicon nitride layer having a first concentration of hydrogen therein may include depositing the first silicon nitride layer in a first ambient containing $SiH_4$, $NH_3$ and $N_2$. The ratio of $SiH_4/N_2$ in the first ambient may be less than 0.01 and the ratio of $NH_3/N_2$ in the first ambient may be less than 0.01. In addition, the step of forming a second silicon nitride layer having a second concentration of hydrogen therein includes depositing the second silicon nitride layer in a second ambient comprising $SiH_4$, $NH_3$ and $N_2$, where a ratio of $SiH_4/N_2$ in the second ambient is greater than 0.01 and a ratio of $NH_3/N_2$ in the second ambient is greater than 0.1.

DETAILED DESCRIPTION OF PREFERRED EMBODIMENTS

Figure 1:
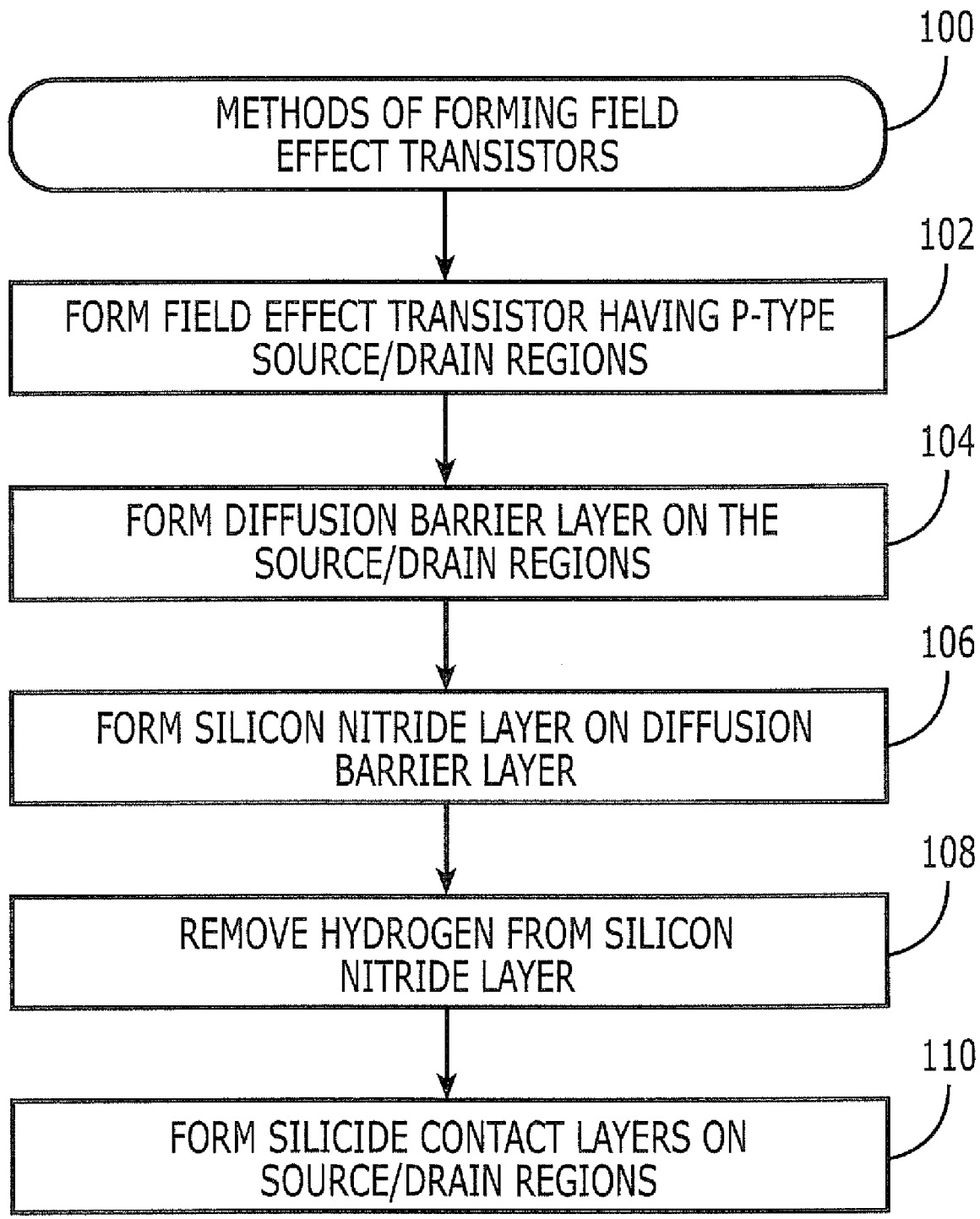
FIG. 1 is a flow diagram of steps that illustrate methods of forming field effect transistors according to embodiments of the present invention.

The present invention will now be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

Referring now to the flow diagram of FIG. 1, methods of forming field effect transistors 100 according to some embodiments of the invention include forming a field effect transistor (e.g., PMOS transistor) having P-type source/drain regions, Block 102, and then forming a diffusion barrier layer on the source/drain regions, Block 104. This diffusion barrier layer may be an electrically insulating layer that operates to inhibit boron out-diffusion from the P-type source/drain regions. These steps are then followed by a step of forming a silicon nitride layer on the diffusion barrier layer, Block 106. A step is then performed to remove hydrogen from the silicon nitride layer in order to increase a tensile stress in a channel region of the PMOS transistor, Block 108. The silicon nitride layer and the diffusion barrier layer are then selectively patterned to expose the source/drain regions, which receive silicide contact layers thereon, Block 110.

Figure 2:
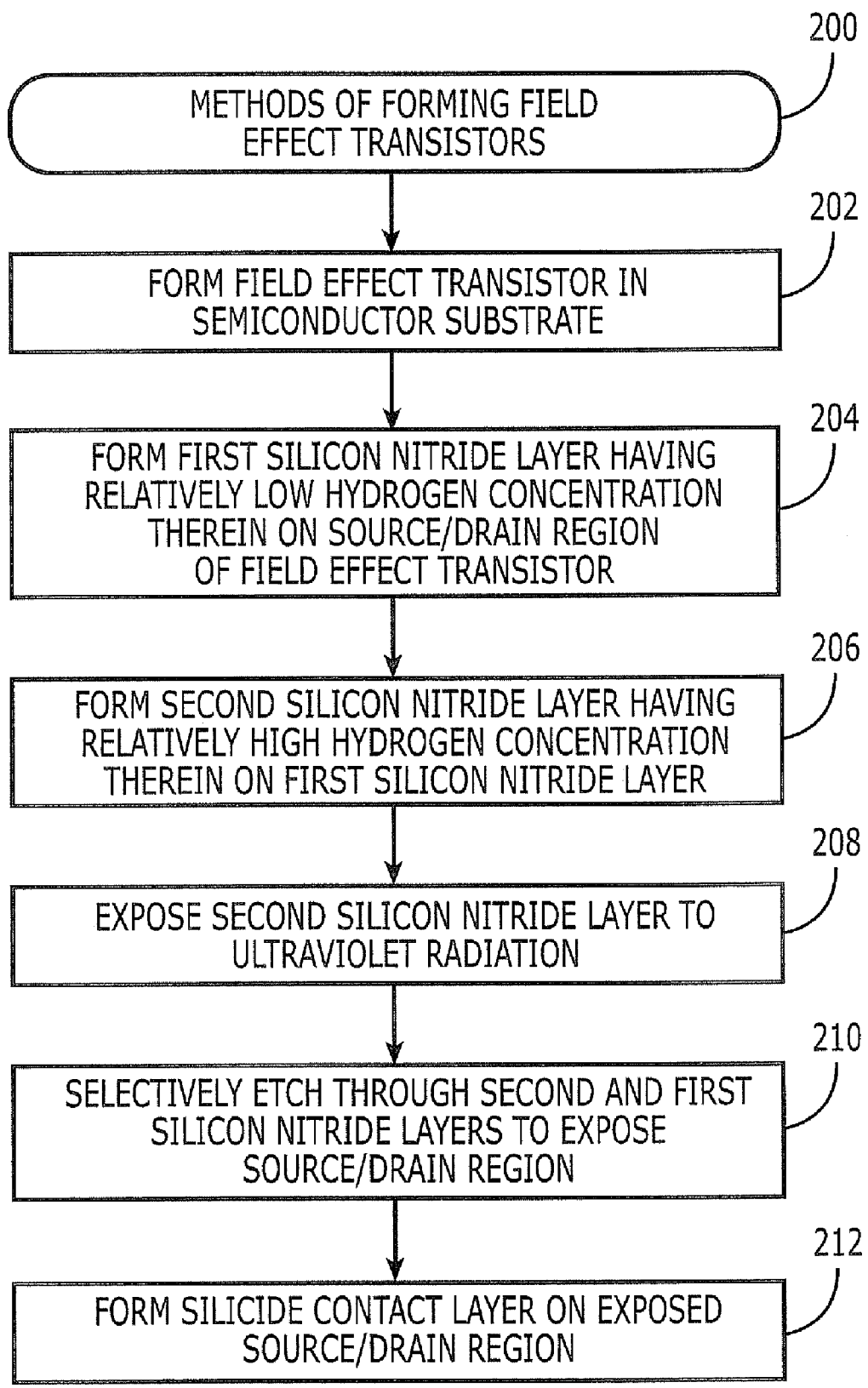
FIG. 2 is a flow diagram of steps that illustrate methods of forming field effect transistors according to embodiments of the present invention.

FIG. 2 illustrates methods of forming field effect transistors 200 according to additional embodiments of the present invention. According to these embodiments, a field effect transistor is formed in a semiconductor substrate, Block 202, and then a first silicon nitride layer having a relatively low concentration of hydrogen therein is formed directly on source/drain regions of the field effect transistor, Block 204. Thereafter, a second silicon nitride layer having a relatively high hydrogen concentration therein, is deposited on the first silicon nitride layer, Block 206. In order to increase a tensile stress in a channel region of the field effect transistor, hydrogen is removed from the second silicon nitride layer by exposing the second silicon nitride layer to ultraviolet radiation, Block 208. Thereafter, the second and first silicon nitride layers are selectively etched in sequence to expose the source/drain regions of the field effect transistor, Block 210. Silicide source/drain contact layers are then formed on the exposed portions of the source/drain regions, Block 212. These silicide contact layers have reduced susceptibility to silicide agglomeration by virtue of the reduced hydrogen content within the first silicon nitride layer, which inhibits dopant out-diffusion from the source/drain regions.

Referring now to FIGS. 3A-3D, methods of forming field effect transistors according to embodiments of the present invention include forming trench isolation regions 12 within a semiconductor substrate 10, to thereby define active regions therein. These active regions may be formed as N-type semiconductor regions within a surrounding N-type semiconductor substrate 10 or as N-type well regions (not shown) within a surrounding P-type region/substrate, for example. Conventional semiconductor processing techniques may then be performed to form a patterned insulated gate electrode on a corresponding active region within the semiconductor substrate 10.

The patterned insulated gate electrode is illustrated as including a patterned gate insulating layer 14 and an electrically conductive gate electrode 16 on the gate insulating layer 14. As will be understood by those skilled in the art, the gate electrode 16 extends opposite a channel region of the field effect transistor.

The insulated gate electrode may be used as an implant mask during a step to form relatively lightly doped source/drain regions 18 (e.g., P− source/drain extension regions) on opposite sides of the gate electrode 16. In particular, these source/drain regions 18 may be formed by implanting source/drain region dopants (e.g., P-type dopants) into the active regions and then diffusing the implanted dopants therein.

Figure 3A:
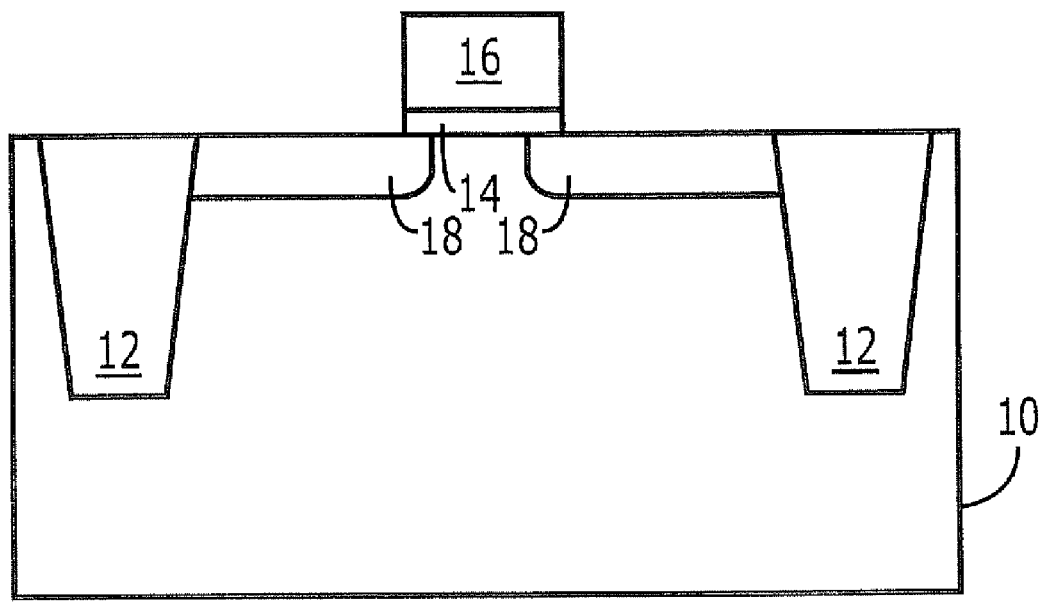
FIGS. 3A-3D are cross-sectional views of intermediate structures that illustrate methods of forming field effect transistors according to embodiments of the present invention.
Figure 3B:
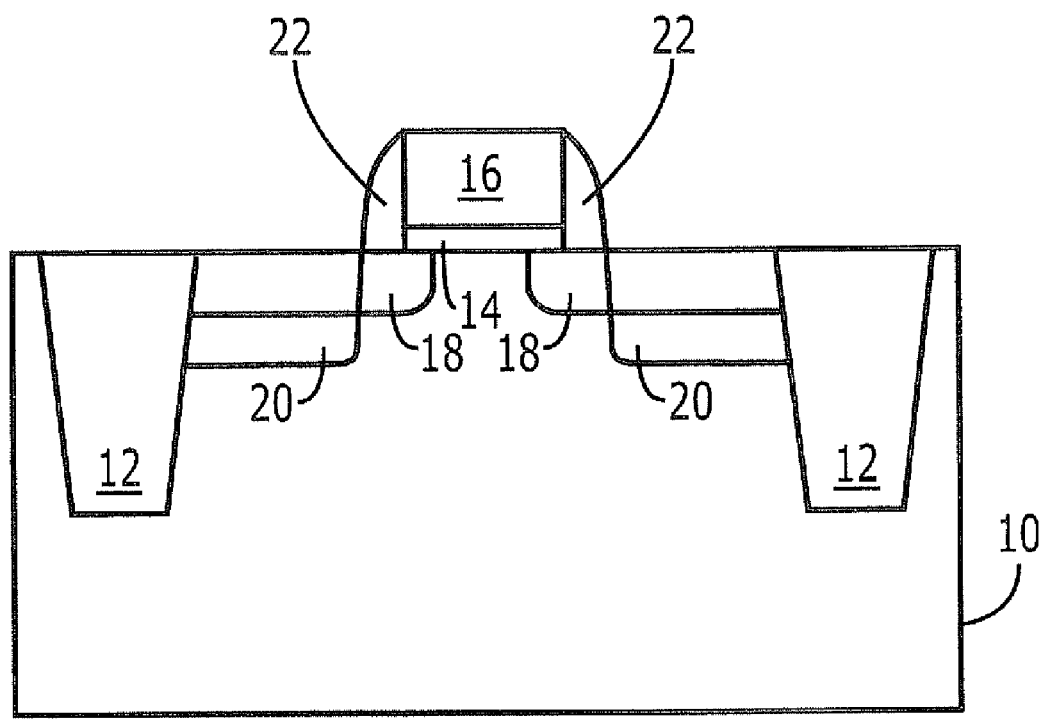

Thereafter, as illustrated by FIG. 3B, sidewall insulating spacers 22 are formed on sidewalls of the gate electrode 16 using, for example, conventional spacer fabrication techniques. These sidewall spacers 22 and gate electrode 16 are then used as an implant mask during a step to form relatively highly doped source/drain regions 20 (e.g., P+ source/drain regions) in the substrate 10 by implanting P-type source/drain region dopants (e.g., boron) at a relatively high dose into the active regions and then diffusing the dopants therein.

Figure 3C:
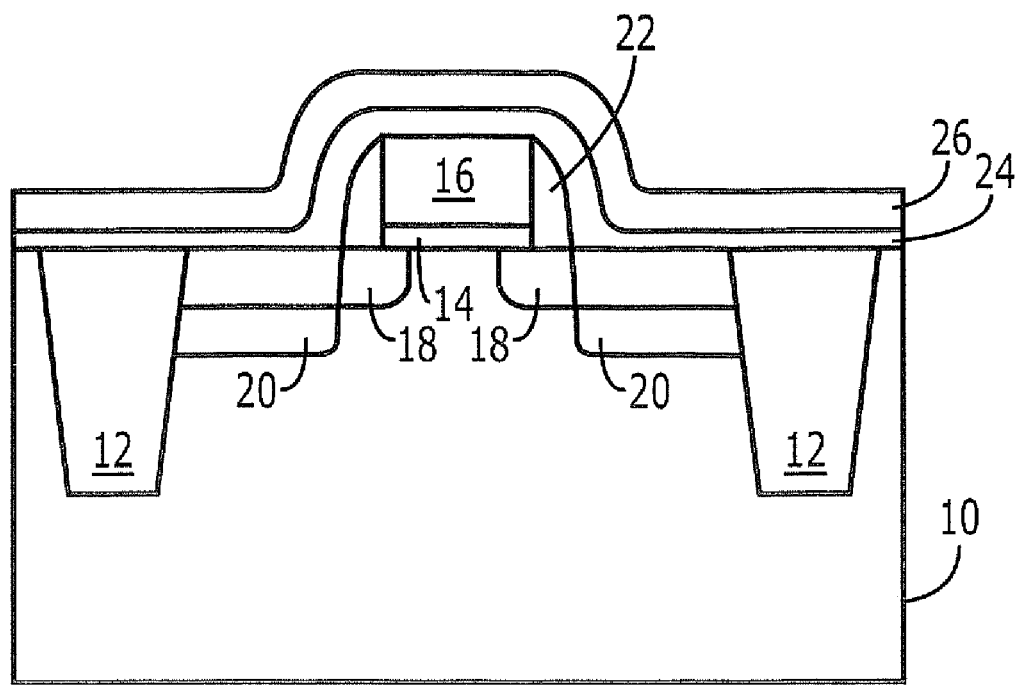

Next, as illustrated by FIG. 3C, a diffusion barrier layer 24 is conformally deposited on the gate electrode 16 and on the source/drain regions 20. This diffusion barrier layer 24, which operates to block out-diffusion of dopants (e.g., boron) from the source/drain regions 20 during subsequent fabrication steps, may have a thickness in a range from about 50 Å to about 300 Å. A silicon nitride layer 26 containing hydrogen is then deposited on the diffusion barrier layer 24. This silicon nitride layer may be deposited to have a thickness in a range from about 100 Å to about 1000 Å.

According to some of these embodiments of the present invention, the step of forming the diffusion barrier layer 24 includes forming a first silicon nitride layer having a first concentration of hydrogen therein, on the source/drain regions 20. In addition, the step of forming a silicon nitride layer 26 on at least portions of the diffusion barrier layer 24 includes forming a second silicon nitride layer 26 having a second concentration of hydrogen therein that is greater than the first concentration, on the first silicon nitride layer. According to preferred aspects of these embodiments, the step of forming the first silicon nitride layer may include depositing the first silicon nitride layer in a first ambient containing $SiH_4$, $NH_3$ and $N_2$. A ratio of $SiH_4/N_2$ in the first ambient may be less than 0.01 and the ratio of $NH_3/N_2$ in the first ambient may be less than 0.01 to thereby maintain a relatively low concentration of hydrogen within the first silicon nitride layer. In contrast, the step of forming a second silicon nitride layer having a second concentration of hydrogen therein may include depositing the second silicon nitride layer in a second ambient comprising $SiH_4$, $NH_3$ and $N_2$, where a ratio of $SiH_4/N_2$ in the second ambient is greater than 0.01 and a ratio of $NH_3/N_2$ in the second ambient is greater than 0.1.

Figure 3D:
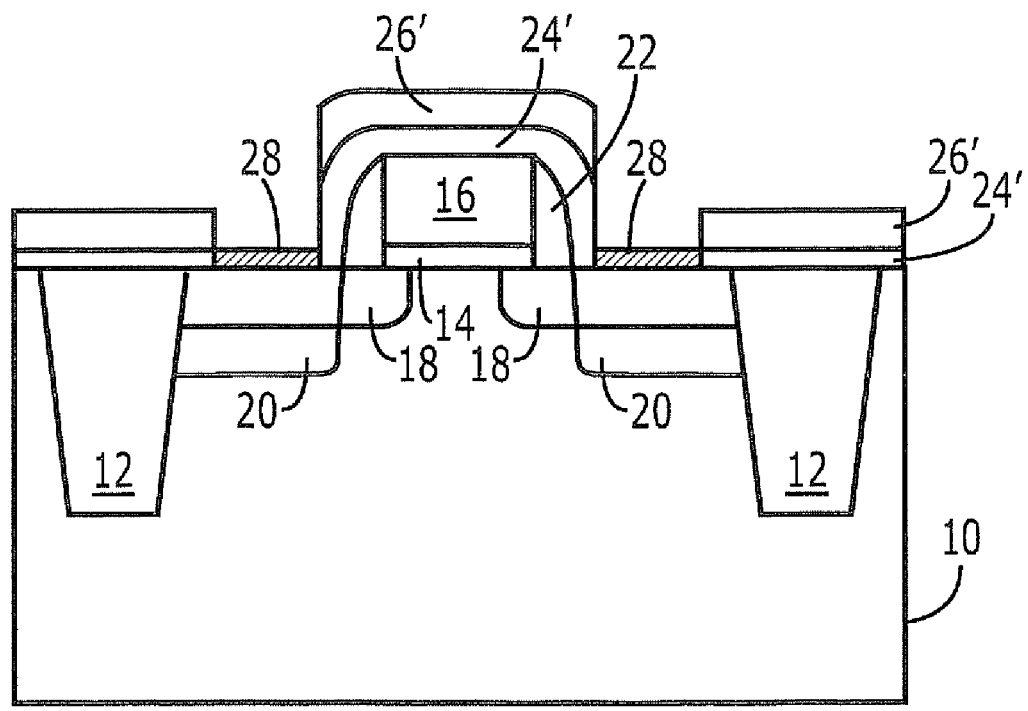

In order to improve transistor performance by increasing carrier mobility, a tensile stress within the channel region of the field effect transistor is increased by removing hydrogen from the deposited silicon nitride layer 26. This step of removing hydrogen from the deposited silicon nitride layer 26 can be performed by exposing the silicon nitride layer 26 to ultraviolet (UV) radiation. Referring now to FIG. 3D, the silicon nitride layer 26 and the diffusion barrier layer 24 are then patterned to expose the source/drain regions 20. Thereafter, silicide formation techniques may be performed to define silicided source/drain contacts 28 on the source/drain regions 20. Additional back-end processing steps (not shown) may also be performed to define, among other things, connection vias and contacts to the transistor and provide passivation.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit device, comprising:
    forming a field effect transistor having P-type source and drain regions, in a semiconductor substrate;
    forming a diffusion barrier layer on the source and drain regions, said diffusion barrier layer comprising a material that inhibits out-diffusion of dopants from the source and drain regions; then
    forming a silicon nitride layer having a concentration of hydrogen therein on at least first and second portions of the diffusion barrier layer, said first and second portions extending between the source and drain regions and the silicon nitride layer; and
    removing hydrogen from the silicon nitride layer by exposing the silicon nitride layer to ultraviolet radiation.

2. The method of claim 1, wherein forming a diffusion barrier layer comprises forming a first silicon nitride layer having a first concentration of hydrogen therein, on the source and drain regions; and wherein forming a silicon nitride layer on at least portions of the diffusion barrier layer comprises forming a second silicon nitride layer having a second concentration of hydrogen therein that is greater than the first concentration, on the first silicon nitride layer.

3. The method of claim 2, wherein the first silicon nitride layer has a thickness in a range from about 50 Å to about 300 Å.

4. The method of claim 3, wherein the second silicon nitride layer has a thickness in a range from about 100 Å to about 1000 Å.

5. The method of claim 2, wherein forming a first silicon nitride layer having a first concentration of hydrogen therein comprises depositing the first silicon nitride layer in a first ambient comprising $SiH_4$, $NH_3$ and $N_2$; and wherein a ratio of $SiH_4/N_2$ in the first ambient is less than 0.01.

6. The method of claim 5, wherein a ratio of $NH_3/N_2$ in the first ambient is less than 0.01.

7. The method of claim 2, wherein forming a first silicon nitride layer having a first concentration of hydrogen therein comprises depositing the first silicon nitride layer in a first ambient comprising $SiH_4$, $NH_3$ and $N_2$; and wherein a ratio of $NH_3/N_2$ in the first ambient is less than 0.01.

8. The method of claim 5, wherein forming a second silicon nitride layer having a second concentration of hydrogen therein comprises depositing the second silicon nitride layer in a second ambient comprising $SiH_4$, $NH_3$ and $N_2$; and wherein a ratio of $SiH_4/N_2$ in the second ambient is greater than 0.01.

9. The method of claim 8, wherein a ratio of $NH_3/N_2$ in the second ambient is greater than 0.1.

10. The method of claim 6, wherein forming a second silicon nitride layer having a second concentration of hydrogen therein comprises depositing the second silicon nitride layer in a second ambient comprising $SiH_4$, $NH_3$ and $N_2$; and wherein a ratio of $SiH_4/N_2$ in the second ambient is greater than 0.01.

11. The method of claim 10, wherein a ratio of $NH_3/N_2$ in the second ambient is greater than 0.1.

12. The method of claim 2, wherein said removing is followed by:
  patterning the first and second silicon nitride layers to expose the source and drain regions; and
  forming silicide contact layers directly on the source and drain regions.

* * * * *